(12) United States Patent
Yu

(10) Patent No.: US 10,707,450 B2
(45) Date of Patent: Jul. 7, 2020

(54) OLED THIN FILM PACKAGING STRUCTURE AND METHOD

(71) Applicant: Wuhan China Star Optoelectronics Technology Co., Ltd., Wuhan, Hubei (CN)

(72) Inventor: Wei Yu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/327,127

(22) PCT Filed: Dec. 29, 2016

(86) PCT No.: PCT/CN2016/113042
§ 371 (c)(1),
(2) Date: Apr. 20, 2018

(87) PCT Pub. No.: WO2018/119885
PCT Pub. Date: Jul. 5, 2018

(65) Prior Publication Data
US 2019/0140215 A1    May 9, 2019

(30) Foreign Application Priority Data

Dec. 26, 2016  (CN) .............................. 201611216797

(51) Int. Cl.
*H01L 29/08*     (2006.01)
*H01L 51/56*     (2006.01)
(Continued)

(52) U.S. Cl.
CPC .......... *H01L 51/56* (2013.01); *H01L 51/5253* (2013.01); *H01L 51/5256* (2013.01); *H01L 27/3244* (2013.01)

(58) Field of Classification Search
CPC .. H01L 51/56; H01L 51/5253; H01L 51/5256
See application file for complete search history.

(56) References Cited

U.S. PATENT DOCUMENTS

2016/0079286 A1\* 3/2016 Jin .................... H01L 29/66742
257/71
2016/0300896 A1   10/2016 Park
(Continued)

FOREIGN PATENT DOCUMENTS

CN        104103660        10/2014
CN        104659051         5/2015
(Continued)

OTHER PUBLICATIONS

International Search Report and Written Opinion for International Application No. PCT/CN2016/113042, dated Oct. 9, 2017.
(Continued)

*Primary Examiner* — Didarul A Mazumder
*Assistant Examiner* — Wasiul Haider

(57) ABSTRACT

Disclosed is an OLED thin film packaging structure, including: a TFT substrate, an OLED, a first barrier layer, a first buffer layer, and a second barrier layer. The OLED is disposed on the TFT substrate. The first barrier layer is disposed on four sides and an upper surface of the OLED. The first buffer layer is disposed on an upper surface of the first barrier layer, and the second barrier layer covers the first barrier layer and the first buffer layer. An OLED thin film packaging method includes steps of: preparing a first barrier layer and a first buffer layer by using a first mask, and preparing a second barrier layer by using a second mask, thereby reducing a quantity of times for changing a mask, reducing a quantity of particles, and improving a thin film packaging effect.

6 Claims, 3 Drawing Sheets

(51) Int. Cl.
*H01L 51/52* (2006.01)
*H01L 27/32* (2006.01)

(56) References Cited

U.S. PATENT DOCUMENTS

2016/0336542 A1* 11/2016 Chen ................. H01L 21/67167
2017/0256739 A1* 9/2017 Kim ................... G02F 1/133308
2018/0102505 A1* 4/2018 Qian ................... H01L 27/3241

FOREIGN PATENT DOCUMENTS

| CN | 105098091 | 11/2015 |
| CN | 105118933 | 12/2015 |
| CN | 105609655 | 5/2016 |
| CN | 105679969 A | 6/2016 |
| JP | 2016145374 | 8/2016 |
| TW | 201025695 A | 7/2010 |

OTHER PUBLICATIONS

Chinese Office Action and Search Report for Chinese Patent Application No. 201611216797.4 dated Dec. 26, 2017.
Chinese Office Action and Search Report for Chinese Patent Application No. 201611216797.4 dated May 9, 2018.

* cited by examiner

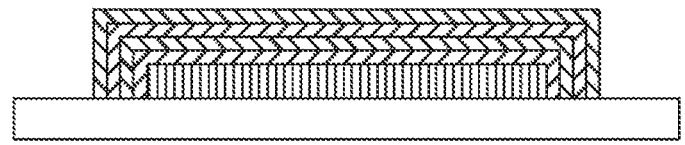
Fig. 2(d) (Prior Art)
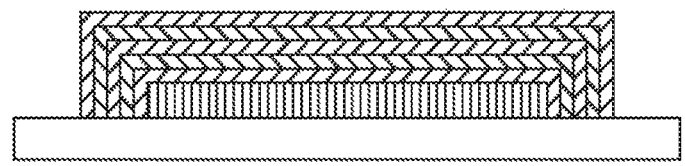
Fig. 2(e) (Prior Art)
Fig. 2
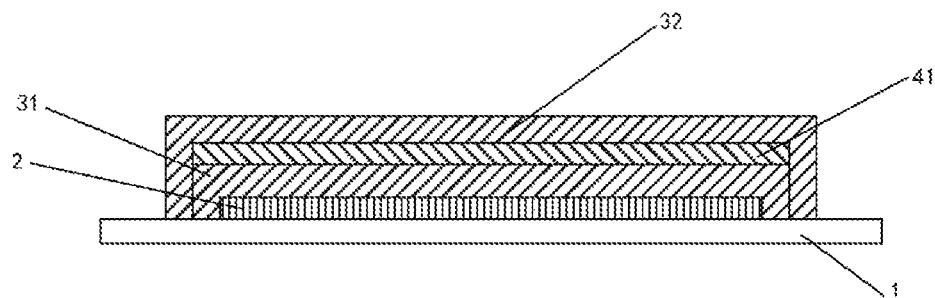
Fig. 3

OLED THIN FILM PACKAGING STRUCTURE AND METHOD

CROSS-REFERENCE TO RELATED APPLICATIONS

The present application claims the priority of Chinese patent application CN 201611216797.4, entitled "OLED Thin Film Packaging Structure and Method", and filed on Dec. 26, 2016, the entirety of which is incorporated herein by reference.

FIELD OF THE INVENTION

The present disclosure relates to an OLED thin film packaging structure and method in the field of liquid crystal display.

BACKGROUND OF THE INVENTION

An OLED display device is a new-generation display device. An organic thin film, which is packaged between a cathode metal and an anode metal, is formed on an OLED substrate. When a voltage is applied to the two electrodes, the organic thin film emits light. The OLED display device has many advantages, including its capability of realizing flexible display. For example, a flexible OLED panel can be formed by using a flexible plastic substrate as a carrier and using a thin film packaging procedure.

Currently, an OLED thin film packaging structure is mainly formed by laminating a barrier layer and a buffer layer. As shown in FIG. 1 (a three-layer structure), the structure includes an OLED 2 disposed on a TFT substrate 1, a barrier layer 3 covering the OLED 2, a buffer layer 4 covering the barrier layer 3, and an outermost barrier layer 5 covering the buffer layer.

The barrier layer is made of an inorganic material such as a silicon nitride material. The buffer layer is usually made of an organic or a partially organic material. The barrier layer is used for blocking water and oxygen. The buffer layer is mainly used for eliminating strain between the two barrier layers and covering defects and pinholes in the barrier layers. The barrier layer and the buffer layers can both be prepared by a plasma-enhanced chemical vapor deposition (PECVD) machine.

The PECVD machine needs to be provided with a mask. The mask covers an OLED device on which a thin film is formed by a gas flowing through an opening of the mask. The OLED device is thus isolated from outside air, and thin film packaging is realized.

In order to avoid invasion by water and oxygen from a side of the OLED device, an area of an outer thin film is required to be larger than that of an inner one, ensuring that sides and a top of the OLED device are protected by a same quantity of thin films. FIG. 2 (a), FIG. 2 (b), FIG. 2 (c), FIG. 2 (d), and FIG. 2 (e) show five steps of an OLED thin film packaging method, in which barrier layers and buffer layers are sequentially provided on the OLED device. In FIG. 2 (a), a barrier layer is coated on the OLED device; in FIG. 2 (b), a barrier layer is coated on the buffer layer in FIG. 2 (a); and these operations are repeated in following steps. This requires that an opening of a mask used for depositing an outer thin film be larger than that of a mask used for depositing an inner thin film. For a structure consisting of, for example, five thin films, five different masks are required. When two kinds of thin films are prepared in a single cavity, masks need to be changed for four times (a first mask is already in the machine). Because currently, the PECVD can prepare both the barrier layer and the buffer layer, out of consideration of costs, in research, many institutes use only a single cavity to prepare two kinds of thin films. This can leads to inter-pollution between the two kinds of thin films. Furthermore, masks need to be frequently changed (a mask needs to be changed once a thin film is formed). Frequent changing of masks produces a large number of particles, which are considered as one of the main factors affecting a packaging effect of the thin film. Water and oxygen may enter into the packaging structure through gaps at edges of the particles. For a thin film packaging structure, it is therefore significant to reduce the quantity of the particles.

SUMMARY OF THE INVENTION

The present disclosure aims at eliminating the defect that frequent changing of masks in an existing device produces a large number of particles which affects a thin film packaging effect, and reducing a bad packaging effect of the thin film brought by the changing of masks.

The aim of the present disclosure and the technical problem of the present disclosure are achieved and solved by using the following technical solutions.

An OLED thin film packaging structure is provided. The OLED thin film packaging structure comprises a TFT substrate, an OLED, a first barrier layer, a first buffer layer, and a second barrier layer. The OLED is disposed on the TFT substrate, the first barrier layer is disposed on four sides and an upper surface of the OLED, the first buffer layer is disposed on an upper surface of the first barrier layer, and the second barrier layer covers the first barrier layer and the first buffer layer.

In the OLED thin film packaging structure, a thickness of the first barrier layer disposed on the four sides of the OLED is equal to a sum of thicknesses of the first barrier layer and the first buffer layer disposed on the upper surface of the OLED.

The OLED thin film packaging structure further comprises a second buffer layer disposed on an upper surface of the second barrier layer and a third barrier layer covering the second buffer layer and the second barrier layer.

In the OLED thin film packaging structure, a thickness of the second barrier layer disposed on four sides of the first barrier layer and the first buffer layer is equal to a sum of thicknesses of the second buffer layer and the second barrier layer disposed on an upper surface of the first buffer layer.

In the OLED thin film packaging structure, a thickness of the first barrier layer disposed on the upper surface of the OLED is the same as a thickness of the first buffer layer.

In the OLED thin film packaging structure, a thickness of the second barrier layer disposed on an upper surface of the second buffer layer is the same as a thickness of the second buffer layer.

An OLED thin film packaging method is provided. The OLED thin film packaging method comprises the following steps:
  (1) preparing a first buffer layer and a first barrier layer by using a first mask:
  (2) preparing a second barrier layer by using a second mask;
  (3) disposing an OLED on a TFT substrate;
  (4) disposing the first barrier layer on four sides and an upper surface of the OLED;
  (5) disposing the first buffer layer on an upper surface of the first barrier layer; and (6) covering four sides and an upper surface of the first buffer layer and the first barrier layer with the second barrier layer.

The OLED thin film packaging method further comprises the following steps:

(7) preparing a second buffer layer by using a second mask;
(8) preparing a third barrier layer by using a third mask;
(9) disposing a second buffer layer on an upper surface of a second barrier layer; and
(10) disposing the third barrier layer on four sides and an upper surface of the second barrier layer and the second buffer layer.

According to the OLED thin film packaging method, an opening of the second mask is larger than an opening of the first mask.

According to the OLED thin film packaging method, an opening of the third mask is larger than an opening of the second mask.

By means of removing a buffer layer originally disposed on four sides of a barrier layer, and only disposing a buffer layer on an upper surface of a barrier layer can reduce a quantity of times for changing masks, reduce a quantity of particles, and improve a thin film packaging effect.

Adding a thickness of a barrier layer disposed on four sides of an OLED ensures that an original total thickness of the thin film is unchanged. A blocking function is not affected.

BRIEF DESCRIPTION OF THE DRAWINGS

The present disclosure will be described in more detail below by way of embodiments and in conjunction with the accompanying drawings, in which:

FIG. 2 (b) schematically shows step 2 of the OLED thin film packaging method in the prior art:

FIG. 2 (c) schematically shows step 3 of the OLED thin film packaging method in the prior art;

FIG. 2 (d) schematically shows step 4 of the OLED thin film packaging method in the prior art;

FIG. 2 (e) schematically shows step 5 of the OLED thin film packaging method in the prior art;

FIG. 3 schematically shows a three-layer thin film packaging structure of an OLED according to the present disclosure.

In the drawings, same reference numerals are used for same parts. The drawings are not provided by an actual proportion.

DETAILED DESCRIPTION OF THE EMBODIMENTS

Figure 1:
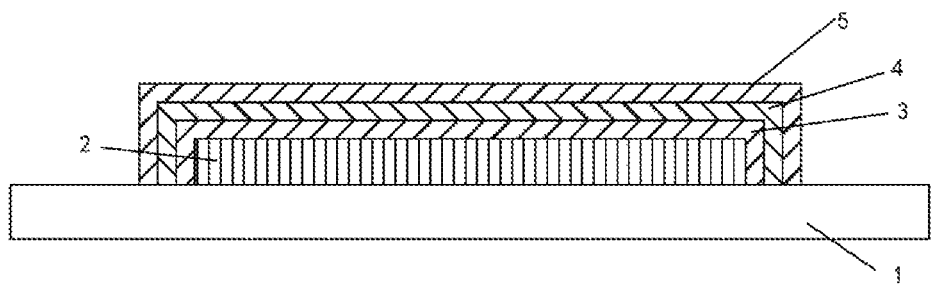
FIG. 1 schematically shows a three-layer thin film packaging structure of an OLED in the prior art.
Figure 2A:
FIG. 2 (a) schematically shows step 1 of an OLED thin film packaging method in the prior art.
Figure 2B:
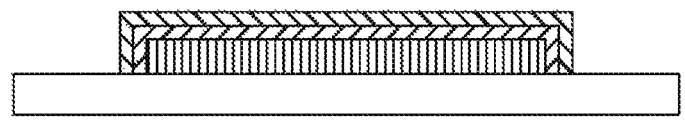
Figure 2C:
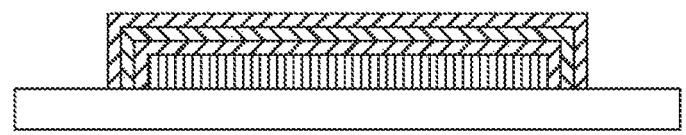
Figure 4:
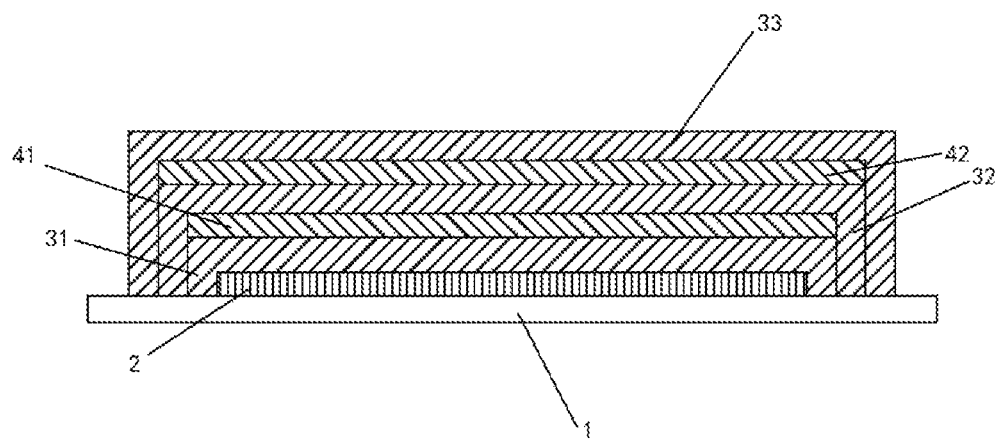
FIG. 4 schematically shows a five-layer thin film packaging structure of an OLED according to the present disclosure.

The present disclosure will be further described below in conjunction with the accompanying drawings.

FIG. 3 schematically shows a three-layer thin film packaging structure of an OLED according to the present disclosure. The thin film packaging structure comprises a TFT substrate 1, and an organic light-emitting diode (OLED) 2 disposed on the TFT substrate. A first barrier layer 31 is disposed on four sides and an upper surface of the OLED.

A first buffer layer 41 is disposed on an upper surface of the first barrier layer 31. A second barrier layer 32 is disposed to cover the first barrier layer 31 and the first buffer layer 41.

A thickness of the first barrier layer disposed on the four sides of the OLED 2 is equal to a sum of thicknesses of the first barrier layer and the first buffer layer disposed on the upper surface of the OLED 2. A thickness of the first barrier layer disposed on the upper surface of the OLED 2 is consistent with a thickness of the first buffer layer. Such setting adds the thickness of the barrier layer disposed on the four sides of the OLED 2, so that a thickness of a film disposed on the four sides of the OLED is consistent with a film disposed on the upper surface of the OLED, thus achieving a better blocking function. That is, a sum of thicknesses of three layers of films in a direction parallel to the upper surface of the OLED is the same as a sum of thicknesses of three layers of films in a direction parallel to an upper surface of an OLED in the prior art. A thickness of two layers of films in a direction parallel to the four sides of the OLED is the same as a thickness of two layers of films in a direction parallel to four sides of the OLED in the prior art.

The buffer layer, made of an organic material, is soft, and can eliminate strain between the two barrier layers and cover defects and pinholes.

FIG. 5 schematically shows a five-layer thin film packaging structure of the OLED according to the present disclosure. The five-layer thin film packaging structure comprises a TFT substrate 1 and an OLED 2 disposed on the TFT substrate 1. A first barrier layer 31 is disposed on four sides and an upper surface of the OLED 2. A first buffer layer 41 is disposed on an upper surface of the first barrier layer 31. A second barrier layer 32 is disposed to cover the first barrier layer 31 and the first buffer layer 41. A second buffer layer 42 is disposed on an upper surface of the second barrier layer 32. A third barrier layer 33 is provided to cover the second buffer layer 42 and the second barrier layer 32.

A thickness of the second barrier layer disposed on four sides of the first barrier layer 31 and the first buffer layer 41 is equal to a sum of thicknesses of the second buffer layer 42 and the second barrier layer disposed on an upper surface of the first buffer layer 41. A thickness of the second barrier layer disposed on an upper surface of the second buffer layer 42 is the same as a thickness of the second buffer layer 42. The thickness of second the barrier layer disposed on the four sides of the OLED 2 is added to enable a thickness of a film disposed on the four sides of the OLED to be consistent with a film disposed on the upper surface of the OLED, thus achieving a better blocking function. A sum of thicknesses of the five layers of thin films in a direction parallel to the upper surface of the OLED is the same as a sum of thicknesses of five layers of thin films in a direction parallel to an upper surface of an OLED in the prior art. A thickness of the three layers of thin films in a direction parallel to the four sides of the OLED is the same as a sum of thickness of five layers of thin films in a direction parallel to four sides of the OLED in the prior art. The blocking function is unchanged.

An OLED three-layer thin film packaging method, comprising the following steps:

(1) preparing a first buffer layer and a first barrier layer by using a first mask;
(2) preparing a second barrier layer by using a second mask;
(3) disposing an OLED on a TFT substrate;
(4) disposing the first barrier layer on four sides and an upper surface of the OLED;

(5) disposing the first buffer layer on an upper surface of the first barrier layer; and
(6) covering four sides and an upper surface of the first buffer layer and the first barrier layer with the second barrier layer.

The first mask can be used to prepare the first barrier layer and the first buffer layer. The first buffer layer is a plane, and an area of the first buffer layer is the same as an area of an opening of the first mask. Moreover, an area of an opening of the second mask is larger than the area of the opening of the first mask. In this way, films can be prepared twice without changing masks, which prevents a large number of particles from being produced due to frequent changing of marks. Particles are considered as one of the main factors affecting the thin film packaging effect, and water and oxygen may enter into the packaging structure from gaps at edges of particles. The packaging structure can therefore effectively reduce effects on the thin film packaging caused by the quantity of the particles, thereby improving a thin film packaging effect.

An OLED five-layer thin film packaging method comprises the following steps:
(1) preparing a first buffer layer and a first barrier layer by using a first mask;
(2) preparing a second barrier layer by using a second mask;
(3) disposing an OLED on a TFT substrate;
(4) disposing the first barrier layer on four sides and an upper surface of the OLED;
(5) disposing the first buffer layer on an upper surface of the first barrier layer;
(6) covering four sides and an upper surface of the first buffer layer and the first barrier layer with the second barrier layer;
(7) preparing a second buffer layer by using the second mask;
(8) preparing a third barrier layer by using a third mask;
(9) disposing the second buffer layer on an upper surface of the second barrier layer; and
(10) disposing the third barrier layer on four sides and an upper surface of the second barrier layer and the second buffer layer.

The first buffer layer and the first barrier layer are prepared by using the first mask; the second barrier layer and the second buffer layer are prepared by using the second mask; and the third barrier layer is prepared by using the third mask. By means of this, the number of times for changing masks is reduced from 5 (in the prior art) to 3. In this way, films can be prepared twice without changing masks, which prevents a large number of particles from being produced due to frequent changing of marks. Particles are considered as one of the main factors affecting the thin film packaging effect, and water and oxygen may enter into the packaging structure through gaps at edges of particles. The packaging structure can therefore effectively reduce effects on the thin film packaging caused by the quantity of the particles, thereby improving a thin film packaging effect. An area of an opening of the second mask is larger than an area of an opening of the first mask, and an area of an opening of the third mask is larger than the area of the opening of the second mask.

Although the present disclosure has been described with reference to preferred embodiments, various modifications may be made thereto without departing from the scope of the present disclosure, and equivalents may be used for replacing the components therein. In particular, the technical features mentioned in the various embodiments may be combined in any manner as long as there is no structural conflict. The present disclosure is not limited to the specific embodiments disclosed herein, but includes all the technical solutions falling within the scope of the claims.

The invention claimed is:

1. An OLED thin film packaging structure, comprising: a TFT substrate, an OLED, a first barrier layer, a first buffer layer, and a second barrier layer, a second buffer layer, and a third barrier layer, wherein:
   the OLED is disposed on the TFT substrate;
   the first barrier layer is disposed on four sides and an upper surface of the OLED;
   the first buffer layer is disposed on an upper surface of the first barrier layer;
   the second barrier layer covers the first barrier layer, the first buffer layer and the TFT substrate;
   the second buffer layer is disposed on an upper surface of the second barrier layer; and
   the third barrier layer covers the second buffer layer, the second barrier layer and the TFT substrate;
   wherein an area covered by the first barrier layer on the TFT substrate is equal to an area covered by the first buffer layer and smaller than an area covered by the second barrier layer;
   wherein the area covered by the second barrier layer on the TFT substrate is equal to an area covered by the second buffer layer and smaller than an area covered by the third barrier layer.

2. The OLED thin film packaging structure according to claim 1, wherein a thickness of the first barrier layer disposed on the four sides of the OLED is equal to a sum of thicknesses of the first barrier layer and the first buffer layer disposed on the upper surface of the OLED.

3. The OLED thin film packaging structure according to claim 1, wherein a thickness of the second barrier layer disposed on four sides of the first barrier layer and the first buffer layer is equal to a sum of thicknesses of the second buffer layer and the second barrier layer disposed on an upper surface of the first buffer layer.

4. The OLED thin film packaging structure according to claim 1, wherein a thickness of the first barrier layer disposed on the upper surface of the OLED is the same as a thickness of the first buffer layer.

5. The OLED thin film packaging structure according to claim 1, wherein a thickness of the second buffer layer disposed on an upper surface of the second barrier layer is the same as a thickness of the second barrier layer.

6. An OLED thin film packaging method, comprising:
   providing a TFT substrate,
   disposing an OLED on the TFT substrate,
   disposing a first barrier layer around four sides and on an upper surface of the OLED by using a first mask,
   disposing a first buffer layer on an upper surface of the first barrier layer by using the first mask, such that an area covered by the first buffer layer on the TFT substrate is equal to an area covered by the first barrier layer,
   after removing the first mask, disposing a second barrier layer around four sides of the first barrier layer and the first buffer layer, and on an upper surface of the first buffer layer by using a second mask,
   disposing a second buffer layer on an upper surface of the second barrier layer by using the second mask, such that an area covered by the second buffer layer on the TFT substrate is equal to an area covered by the second barrier layer, and after removing the second mask, disposing a third barrier layer around four sides of the second barrier layer and the second buffer layer, and on an upper surface of the second buffer layer by using a third mask;
wherein area covered by the second barrier layer is larger than an area covered by the first barrier layer and smaller than an area covered by the third barrier layer.

\* \* \* \* \*